United States Patent [19]
Roh et al.

[11] Patent Number: 5,325,334
[45] Date of Patent: Jun. 28, 1994

[54] COLUMN REDUNDANCY CIRCUIT FOR A SEMICONDUCTOR MEMORY DEVICE

[75] Inventors: Jae-Gu Roh, Seongnam; Yong-Sik Seok, Daegu, both of Rep. of Korea

[73] Assignee: Samsung Electronics Co., Ltd., Kyungki, Rep. of Korea

[21] Appl. No.: 014,305

[22] Filed: Feb. 5, 1993

[30] Foreign Application Priority Data

May 6, 1992 [KR] Rep. of Korea ............... 1992-7621

[51] Int. Cl.$^5$ ............................................. G11C 7/00
[52] U.S. Cl. ................................. 365/201; 365/96; 365/225.7; 365/200
[58] Field of Search ........... 365/201, 200, 220, 230.03, 365/230.06, 225.7, 96; 371/60.2

[56] References Cited

U.S. PATENT DOCUMENTS

| | | | |
|---|---|---|---|
| 4,758,993 | 7/1988 | Takemae | 365/230.03 |
| 4,827,747 | 6/1989 | Dosauka et al. | 365/230.03 |
| 4,829,480 | 5/1989 | Seo | 365/200 |
| 5,033,024 | 7/1991 | O'Connell et al. | 365/200 |
| 5,159,572 | 6/1992 | Morton | 365/230.03 |
| 5,193,076 | 3/1993 | Houston | 365/230.03 |
| 5,210,723 | 5/1993 | Bates et al. | 365/230.03 |

*Primary Examiner*—Eugene R. LaRoche
*Assistant Examiner*—Tan Nguyen
*Attorney, Agent, or Firm*—Charles R. Donohoe; Robert A. Westerlund; Stephen R. Whitt

[57] ABSTRACT

A column redundancy circuit for a semiconductor memory device, e.g., a DRAM, which includes a normal memory array comprised of a plurality of memory blocks each comprised of a matrix of rows and columns of memory cells, with at least two of the memory blocks sharing common columns, and with at least one of the columns being defective, in the sense of being connected to at least one memory cell which has been determined to be defective. The column redundancy circuit includes a plurality of redundant columns, block selection control circuit which is programmed to generate a first output signal in response to receipt of a memory block address signal corresponding to one or more of the memory blocks which contain the defective column, a column address decoder which is programmed to generate a second output signal in response to receipt of both the first output signal and a column address signal corresponding to the defective column, and, a redundant column driver circuit which is responsive to the second output signal for activating a predetermined one of the redundant columns, to thereby repair the defective column. In a preferred embodiment, the block selection control circuit and the column address decoder each include a plurality of fuses and are each programmed by means of a selected one or more of their fuses being blown, e.g., by use of a laser.

19 Claims, 7 Drawing Sheets

COLUMN REDUNDANCY CIRCUIT FOR A SEMICONDUCTOR MEMORY DEVICE

BACKGROUND OF THE INVENTION

The present invention relates generally to semiconductor memory devices, e.g., DRAMs, and more particularly, to a column redundancy circuit therefor.

One of the major determinants of the cost of producing memory chips is wafer yield, which is defined as the ratio of non-defective chips/total chips fabricated on a given wafer. In general, the higher the integration density of the memory chip, the higher the probability that one or more memory cells thereof will be defective. Thus, the higher the integration density of the chips fabricated on a given wafer, the lower the wafer yield. Accordingly, the need for a method in which to correct defects in order to enhance wafer yield became more acute with the advent of high-density memory chips.

The single most effective method in which to correct memory cell defects in order to enhance wafer yield is the provision of a redundant memory circuit in which one or more redundant rows and/or columns of memory cells are provided in order to replace rows and/or columns of the main memory array which are found to be defective, during testing, e.g., during wafer sort. In general, the redundant rows and/or columns have initially unspecified addresses and redundant decoders coupled thereto. The redundant decoders are programmable in such a manner as to match the addresses of rows and/or columns which are determined to be defective. The defective rows and/or columns are decoupled or disabled.

In operation, when a memory read or write cycle is executed, access to the defective rows and/or columns is prevented, and the redundant decoders are responsive to only the addresses of the defective rows and/or columns, to thereby effectively replace the defective rows and/or columns with the redundant rows and/or columns, which are sometimes referred to as spare rows and/or columns. This technique of replacing defective rows and/or columns with redundant rows and/or columns is oftentimes referred to as repairing defective memory cells.

A typical implementation of the programmable redundant decoder is an address decoder in which a polysilicon fusible link, i.e., fuse, is connected to each address bit line of a row address or column address buffer, depending upon whether the redundant decoder is a redundant row or column decoder, respectively. In order to program such a redundant decoder with the address of a column or row of memory cells having a defective memory cell, selected ones of the fuses are cut/blown, e.g., by means of a laser.

With reference now to FIG. 1, there can be seen a representational block diagram of the organizational structure of a multi-block memory device and the row and column address decoders therefor. As can be seen, the memory device depicted in FIG. 1 includes an m×n normal memory cell array and an m×k redundant memory cell array. In operation, fuse boxes FB1-FBk generate signals $\phi$REN1-$\phi$RENk, respectively, which indicate the receipt of a column address signal corresponding to a defective column in the normal memory cell array. More particularly, if a column common to normal cell arrays NCA12-NCAm2 is determined to contain a defective memory cell, then the signal $\phi$REN2 will be driven high. The normal decoder control circuit NDC, in response to the signal $\phi$REN2 being driven high, will disable the input/output gates IO12-IOm2 corresponding to the normal cell arrays NCA12-NCAm2, respectively, which share the defective column, by way of disabling the normal column decoder NCD2 corresponding to the defective column. Further, the signals $\phi$REN1-$\phi$RENk generated by the fuse boxes FB1-FBk, respectively, are also applied to redundant column decoders RCD1-RCDk, respectively. The redundant column shared by the redundant cell arrays RCA12-RCAm2 is selected by the corresponding redundant column decoder RCD2, in response to the signal $\phi$REN2 going high, thus effectively replacing the defective column with the redundant column which has been programmed with the address of the defective column.

With reference now to FIG. 2, there can be seen an overall block diagram of the conventional column redundancy circuit, including a redundant column control circuit 100', a fuse box array 200', and a redundant column driver 300'. More particularly, the redundant column control circuit 100', in response to receipt of a row address signal corresponding to that of a defective memory cell, generates a redundancy enable signal RSTP which is applied to a first input of the fuse box array 200'. The fuse box array 200' also receives, at a second input, a column address signal. When the fuse box 200' receives a high logic level RSTP signal at its first input, and a column address signal corresponding to a defective column at its second input, it generates a high logic level output signal, $\phi$RENi, which is referred to as the redundancy sensing signal. The redundancy sensing signal $\phi$RENi is applied to the redundant column driver 300' which, in response to the signal $\phi$RENi, generates an output signal RCSL which activates the redundant or spare column RCAi which has been selected to replace the defective column.

With reference now to FIG. 3, there can be seen a detailed circuit diagram of the fuse box 200' of the conventional column redundancy circuit depicted in FIG. 2. In operation, the fuse box array 200' works as follows. More particularly, in response to the RSTP signal going high, the output signal "b" of the inverter 7 goes high, and the output signal "a" of the inverter 6 goes low, thereby turning on the dual transistors T1 and T2 in the fuse box 200'A of the fuse box array 200'. Assuming that the fuse F1 of the fuse box 200'A has been blown, then the node r1 will remain high, even when the column address bit CAi associated therewith is low. Thus, assuming that negative logic is used, the fuse box 200'A has been programmed to generate a high level signal as its output node r1 only in response to receipt of the column address bit CAi. If the remaining fuse boxes CA2-9 also have their fuses selectively blown in a similar manner, then the fuse box array 200' can be programmed with the column address of the defective column. Thus, the fuse box array 200' can be considered a programmable redundant column address decoder. When the column address corresponding to the defective column is received, it generates an output signal $\phi$RENi having a high logic level. As described previously in conjunction with FIGS. 1 and 2, this signal is then applied to the redundant column driver 300' to activate the selected redundant column for replacing the defective column.

A significant drawback with the above-described conventional column redundancy circuit is that the entire defective column common to several memory sub-arrays is disabled, even though only a portion thereof located within a single one of the sub-arrays may in fact be defective, i.e., the only defective memory cell(s) connected to the defective column may be contained within a single one of the sub-arrays. This results in unnecessary loss of memory space. Moreover, this results in unnecessary usage of valuable and scarce redundant memory space, thereby reducing redundancy efficiency and the, wafer yield.

In order to overcome this limitation, the present inventor has proposed the column redundancy circuit disclosed in U.S. patent application Ser. No. 757,465, entitled "Semiconductor Memory Redundant Device". A partial schematic, partial block diagram of a fuse box utilized in this proposed column redundancy circuit is depicted in FIG. 4. As is evident from FIG. 4, in this proposed column redundancy circuit, the redundancy efficiency is improved by virtue of employing a block selection signal $\phi$BLSki which is applied to a block decoder corresponding to each specific sub-array/-memory block of the memory device, to thereby facilitate repair of only the column of the specific memory block which contains the defective memory cell, rather than all of the memory blocks or sub-arrays which share the defective column. Although this proposed column redundancy circuit constitutes a major improvement over theretofore existing technology, it suffers from the following shortcoming. More particularly, when it is necessary to replace the same column in two or more different memory blocks, the circuit is incapable of doing this, thereby limiting the utility thereof.

Based upon the foregoing, it can be appreciated that there presently exists a need for a column redundancy circuit for a semiconductor memory device which overcomes the above-described limitations and disadvantages of the presently available column redundancy circuits. The present invention fulfills this need.

SUMMARY OF THE INVENTION

The present invention encompasses a column redundancy circuit for a semiconductor memory device, e.g., a DRAM, which includes a normal memory array comprised of a plurality of memory blocks each comprised of a matrix of rows and columns of memory cells, with at least two of the memory blocks sharing common columns, and with at least one of the columns being defective, in the sense of being connected to at least one memory cell which has been determined to be defective. The column redundancy circuit includes a plurality of redundant columns, a block selection control circuit which is programmed to generate a first output signal in response to receipt of a memory block address signal corresponding to one or more of the memory blocks which contain the defective column, a column address decoder which is programmed to generate a second output signal in response to receipt of both the first output signal and a column address signal corresponding to the defective column, and, a redundant column driver circuit which is responsive to the second output signal for activating a predetermined one of the redundant columns, to thereby repair the defective column. In a preferred embodiment, the block selection control circuit and the column address decoder each include a plurality of fuses and are each programmed by means of a selected one or more of their fuses being blown, e.g., by use of a laser.

BRIEF DESCRIPTION OF THE DRAWINGS

These and various other features and advantages of the present invention will be readily understood with reference to the following detailed description taken in conjunction with the accompanying drawings, wherein like reference numerals designate like structural elements, and, in which.

DETAILED DESCRIPTION OF THE INVENTION

Figure 1:
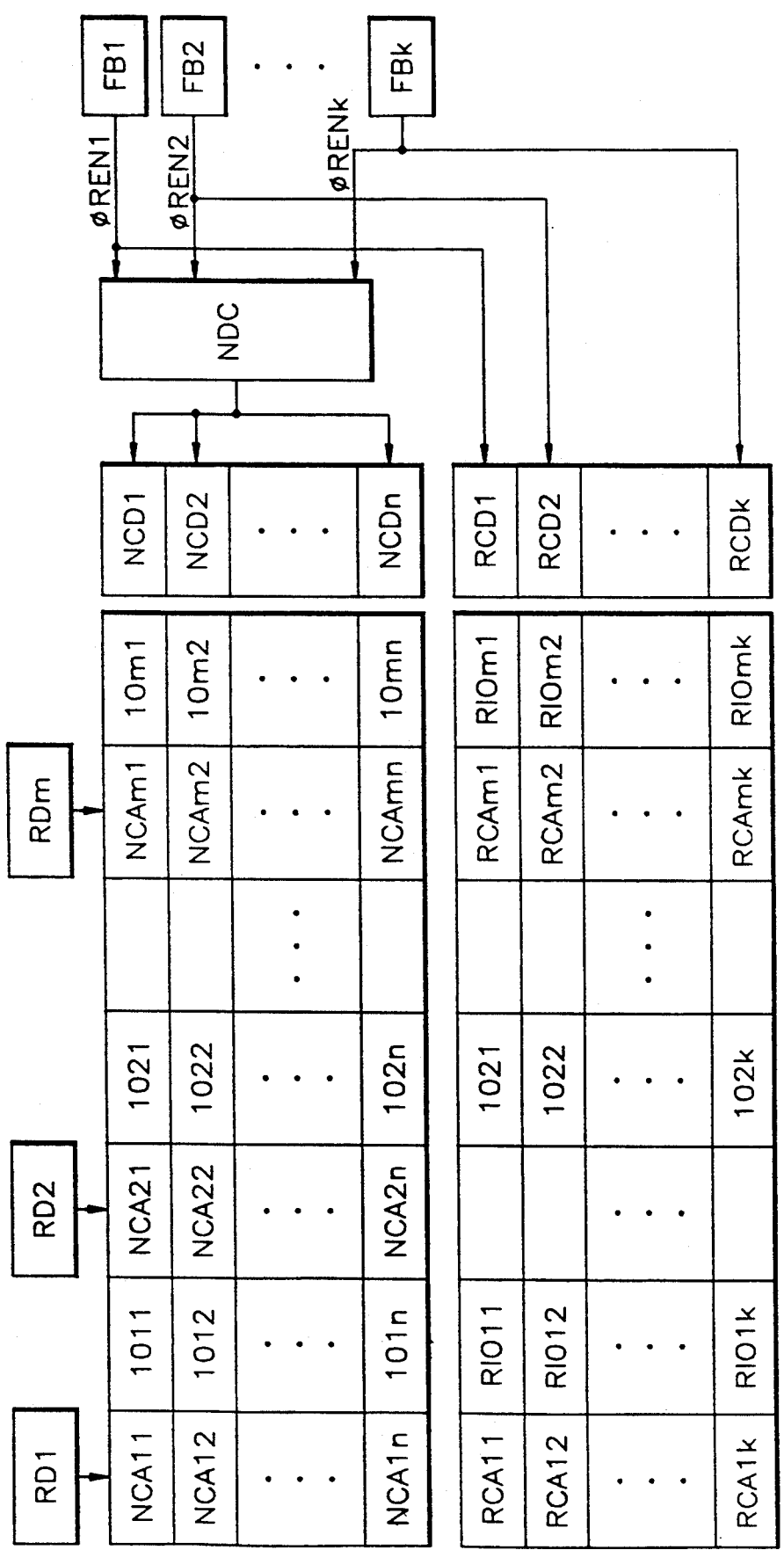
FIG. 1 is a representational block diagram of the organizational structure of a multi-block memory device and the row and column address decoders therefor.
Figure 2:
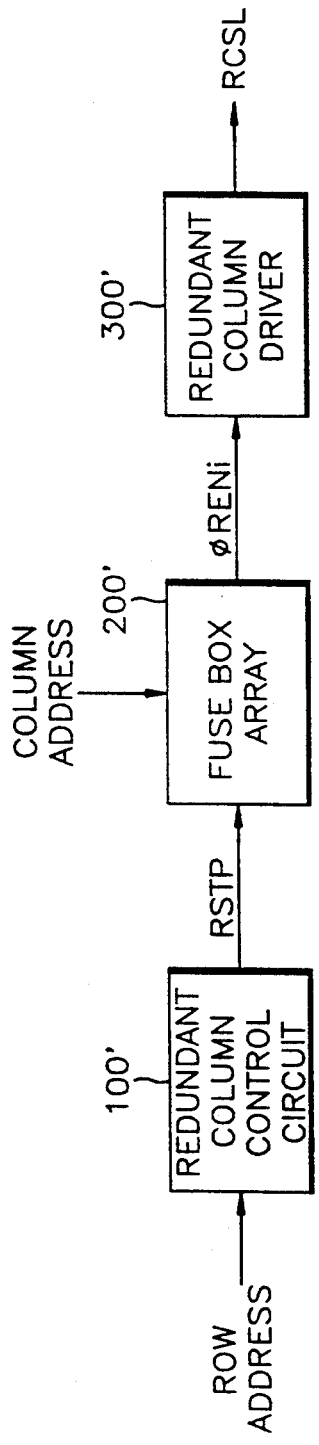
FIG. 2 is a block diagram of a conventional column redundancy circuit for a semiconductor memory device.
Figure 5:
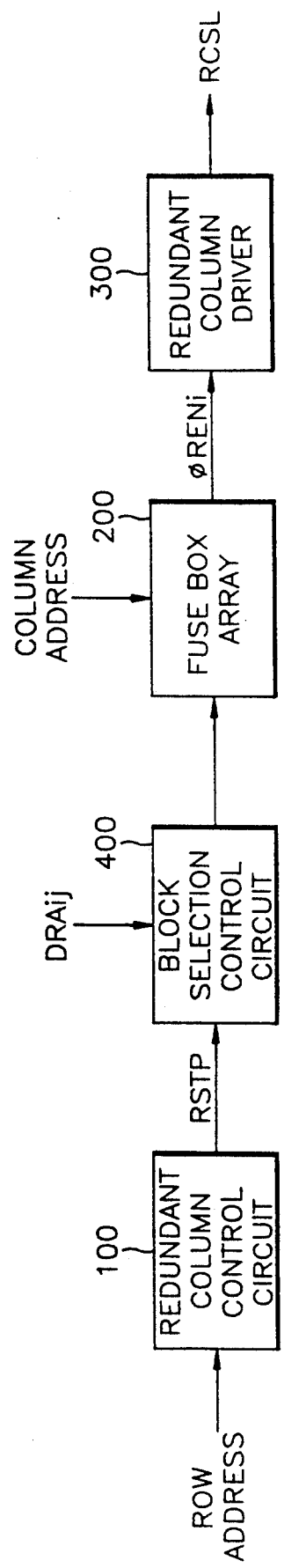
FIG. 5 is a block diagram of a column redundancy circuit constituting a preferred embodiment of the present invention.

With reference now to FIG. 5, a column redundancy circuit constituting a preferred embodiment of the present invention will now be described. More particularly, the column redundancy circuit depicted in FIG. 5 can be seen to include a redundant column control circuit 100, a block selection control circuit 400, a fuse box array 200, and a redundant column driver 300.

The redundant column control circuit 400, in response to receipt of a row address signal corresponding to that of a defective memory cell, generates a redundancy enable signal RSTP which is applied to a first input of the block selection control circuit 400, which constitutes a primary aspect of the present invention. The block selection control circuit 400 also receives, at a second input, a memory block address signal DRAij which identifies a memory block or sub-array which contains a defective column to be repaired.

Figure 7:
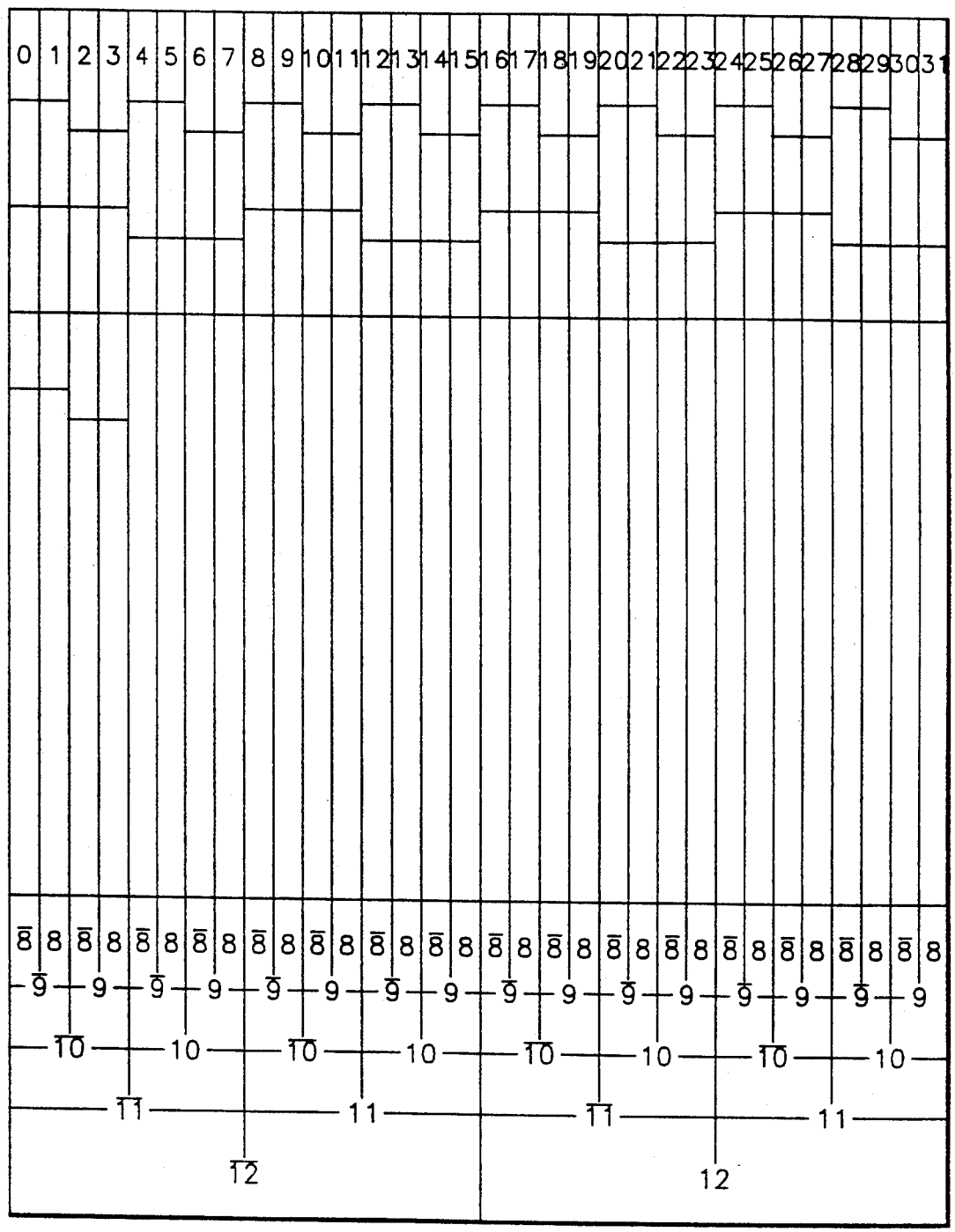
FIG. 7 is a diagrammatical representation of the organizational structure of the memory array of a semiconductor memory device in which the present invention is employed; and, FIG. 8 is a circuit diagram of the fuse box array 200' and the block selection control circuit 400' of an alternative embodiment of the column redundancy circuit depicted in FIG. 5.

With additional reference to FIG. 7, there can be seen the basic organizational structure of the memory array. More particularly, the memory array is divided into two sub-arrays 12 and /12, which are each sub-divided into two sub-arrays 11 and /11, which are each sub-divided into two sub-arrays 10 and /10, which are each sub-divided into two sub-arrays 9 and /9, which are each sub-divided into two sub-arrays 8 and /8. Thus, there are a total of 32 sub-arrays 8 and /8, 16 sub-arrays 9 and /9, 8 sub-arrays 10 and /10, 4 sub-arrays 11 and /11, and 2 sub-arrays 12 and /12, which are selectively reparable in a manner which will become apparent hereinafter.

In general, the block selection control circuit 400 is programmable with the address of any one or more of the above-described sub-arrays which are found to contain a defective column. The block selection control circuit 400 functions, in response to the receipt of a high logic level RSTP signal at its first input, and a memory block address signal DRAij corresponding to a sub-array(s) having a defective column, at its second input, to generate a high level output signal which is applied to the fuse box array 200.

The fuse box array 200, in response to the receipt of a column address signal corresponding to a defective column, then generates a high level redundancy sensing signal φRENi, which is applied to the redundant column driver 300 which, in response to the signal φRENi, generates an output signal RCSL which activates the redundant or spare column which has been selected to replace the defective column.

Figure 3:
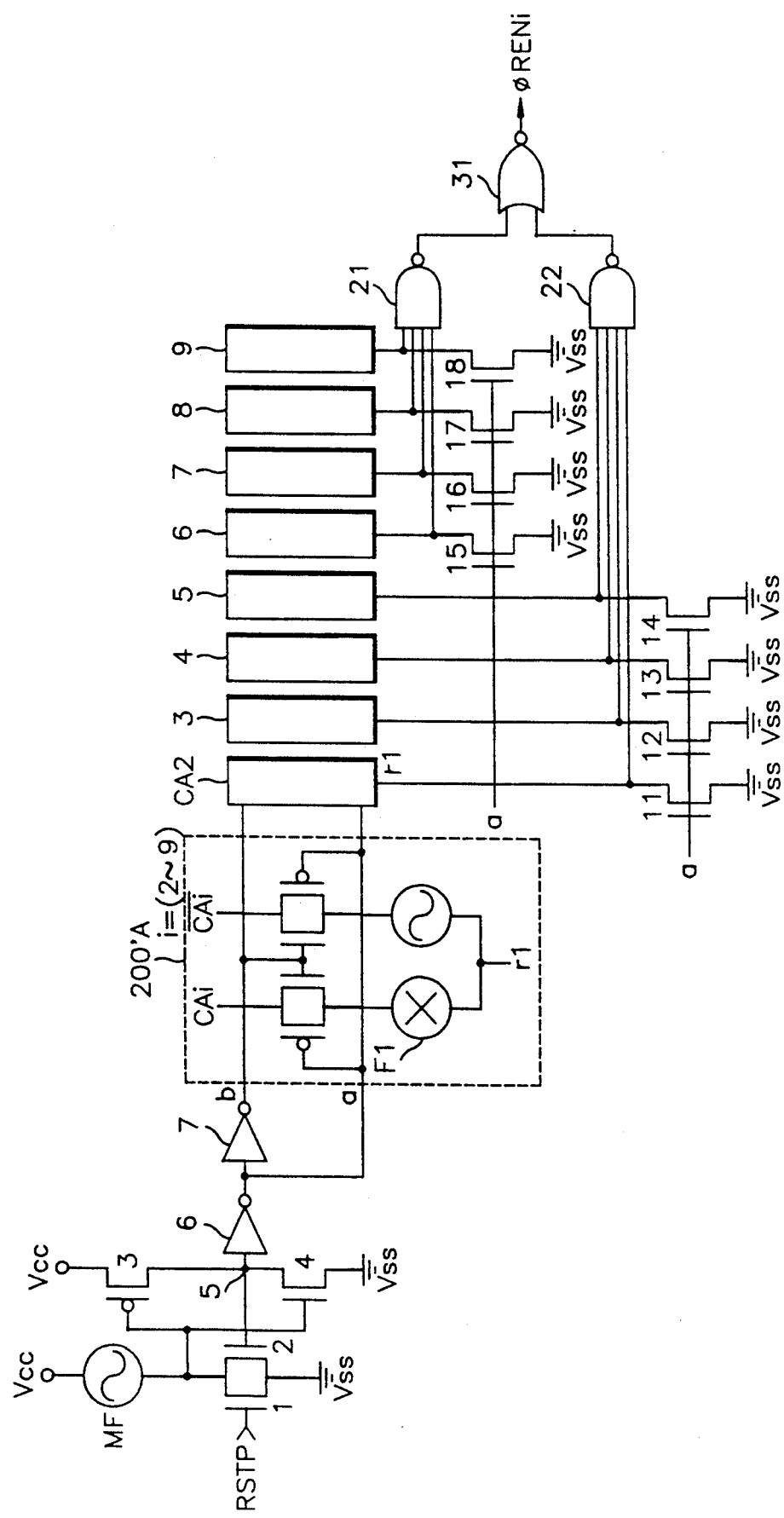
FIG. 3 is a detailed circuit diagram of the fuse box array 200' of the conventional column redundancy circuit depicted in FIG. 2.
Figure 4:
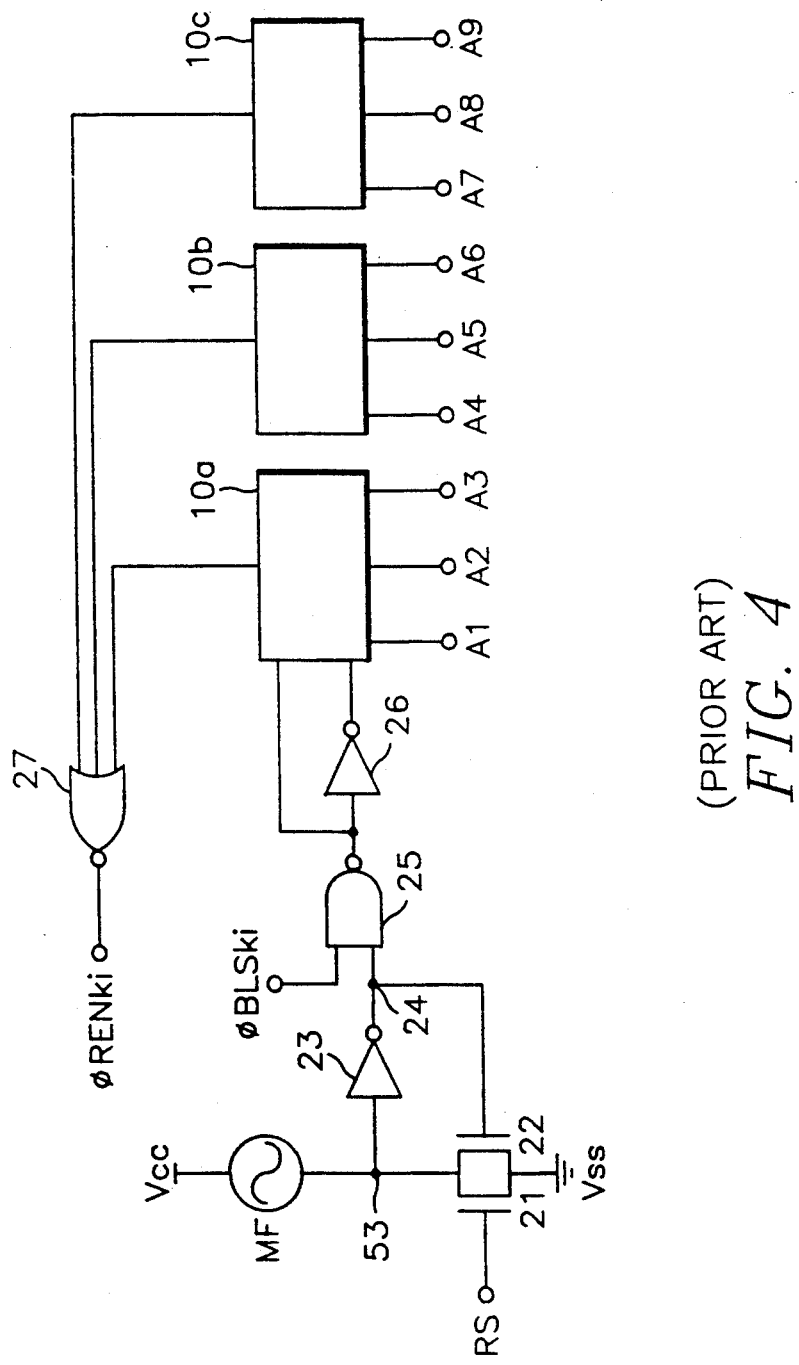
FIG. 4 is a partial schematic, partial block diagram of a column redundancy circuit invented by the present inventor and disclosed in co-pending U.S. patent application Ser. No. 757,465, entitled "Semiconductor Memory Redundant Device"
Figure 6:
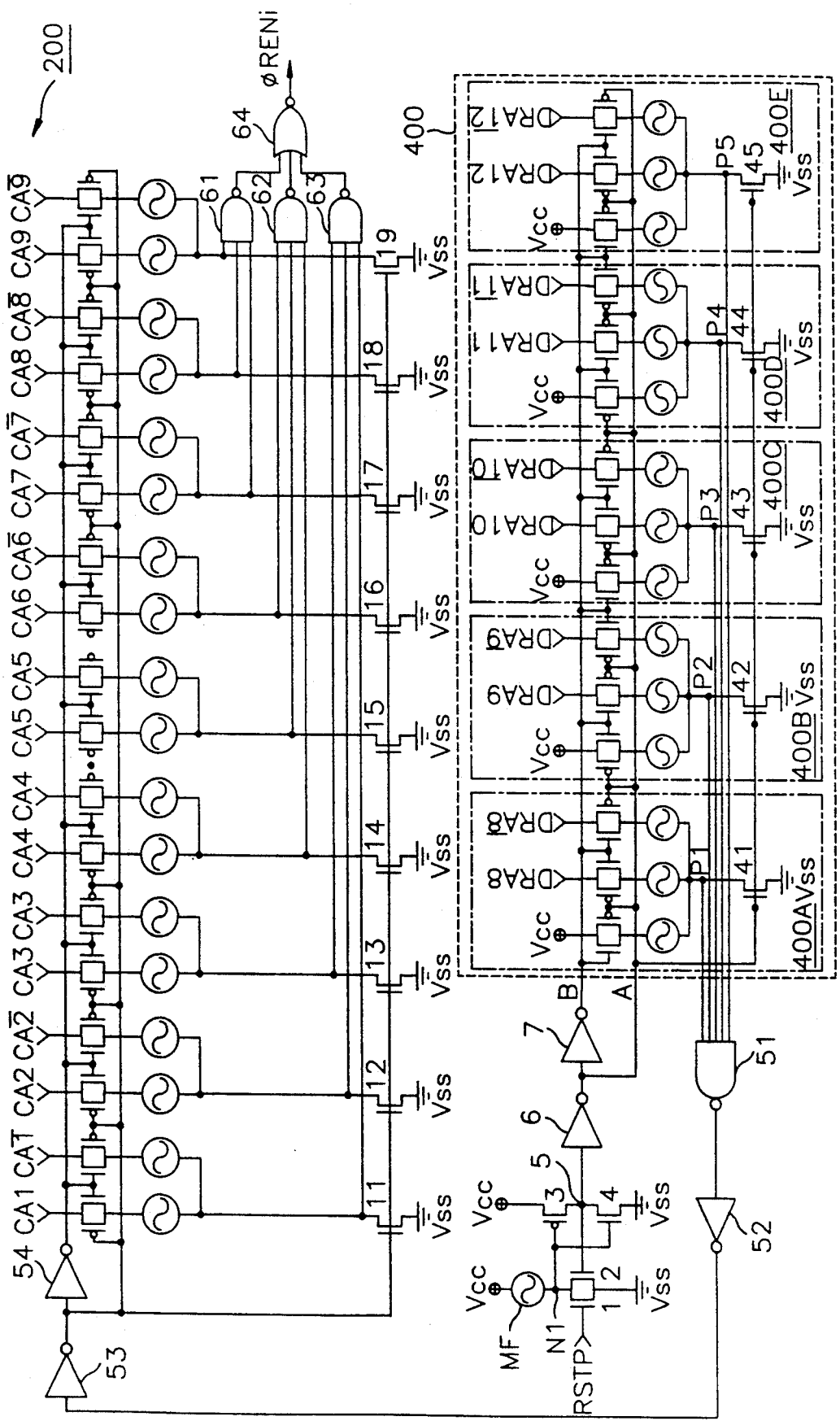
FIG. 6 is a circuit diagram of the fuse box array 200 and the block selection control circuit 400 of the column redundancy circuit depicted in FIG. 5.

With reference now to FIG. 6, there can be seen a circuit diagram of the fuse box array 200 and the block selection control circuit 400 of the column redundancy circuit of the present invention illustrated in FIG. 5. More particularly, the fuse box array 200 is essentially of the same construction and operation as the one depicted in FIG. 3 and described hereinbefore. The block selection control circuit 400 is comprised of a plurality of individually programmable memory block decoders 400A-400E. The construction and operation of the block selection control circuit 400 will be described in detail hereinbelow. In general, the block selection control circuit 400 can be considered to be a programmable memory block address decoder, in that the fuses contained therein can be selectively cut/blown, e.g., by a laser, in order to be responsive to a particular set of memory block address signals DRAij corresponding to any one or more memory blocks or sub-arrays which have been determined to contain a defective column. In this connection, the fuse box array 200 and the block selection control circuit 400 cooperatively function to drive the redundancy sensing signal φRENi to a high logic level (or, a low logic level if inverse logic is employed) when a column address corresponding to a defective column is received by the fuse box array 200, and a memory block address DRAij corresponding to one or more sub-arrays containing the defective column is received by the block selection control circuit 400. Thus, with the column redundancy circuit of the present invention, a defective column shared by two or more sub-arrays can be repaired in any selected one of the sub-arrays, or in any selected two or more of the sub-arrays, thus conserving valuable and scarce redundant memory space where it is unnecessary, thereby enhancing redundancy efficiency and, ultimately, increasing wafer yield. This constitutes a significant improvement over the existing technology.

The construction and operation of the block selection control circuit 400 and its associated circuitry shown in FIG. 6 will now be described in greater detail. Prior to operation, the master fuse MF is cut/blown, e.g., by use of a laser, thereby isolating the node N1 from the power supply voltage Vcc. Thereafter, when the RSTP signal is driven high, the transistor 1 is turned on, thereby discharging the voltage present at node N1 to ground/Vss. As the node N1 is being discharged, the voltage applied to the gate of the PMOS transistor 3 goes low, thereby turning on the transistor 3 and raising the voltage at node 5 to Vcc. As the voltage present at node 5 approaches Vcc, the transistor 2 is more fully turned on, thereby expediting the discharge of the node N1 which, in turn, turns the transistor 3 on harder, thereby expediting the pull-up of node 5 to Vcc.

When the voltage at node 5 goes high, the output of the inverter 6, labelled "A", goes low, and the output of inverter 7, labelled "B", goes high. The output B of the inverter 7 is applied in common to all of the gates of the NMOS transistors in the block selection control circuit 400, and the output A of the inverter 6 is applied in common to all of the gates of the PMOS transistors in the block selection control circuit 400. One pair of PMOS and NMOS transistors in each individually programmable memory block decoder 400A-400E of the block selection control circuit 400 are connected between Vcc and a node P1-P5, respectively, through a fuse element. The other two pairs of PMOS and NMOS transistors in each memory block decoder 400A-400E of the block selection control circuit 400 are connected between complementary memory block address bits of the memory block address signal DRAij and the nodes P1-P5, respectively, through corresponding fuse elements. The nodes P1-P5 are connected to ground/Vss through transistors 41-45, respectively, which are turned off in response to the output A of the inverter 6 going low. The voltages present at the nodes P1-P5 are applied as separate inputs to a five-input NAND gate 51, whose output is applied through the inverters 52, 53, and 54 to the fuse box array 200.

In order to illustrate the operation of each of the individually programmable memory block decoder units 400A-400E, the operation of an exemplary decoder unit 400A will now be described, with the understanding that the other decoder units 400B-400E operate in an analogous manner. More particularly, in order to program the decoder unit 400A with the memory block address DRA8, the fuse element connected to the DRA/8 terminal, and the fuse element connected to the Vcc terminal must be severed/blown. With these fuse elements blown, the node P1 will go high only when the DRA8 bit goes high (indicating the selection of the sub-arrays 8), thereby causing the output of the NAND gate 51 to go low, and the outputs of the inverters 52 and 54 to go high, and the output of the inverter 53 to go low. In this condition, the fuse box array 200 is activated in a manner analogous to that discussed previously in connection with FIG. 3, so that when the column address corresponding to the programmed column address for the defective column is received by the fuse box array 200, the output of the NOR gate 64, which is the redundant sensing signal φRENi, will go high. Of course, as previously described, the redundant column driver 300, in response to the signal φRENi going high, generates a high logic level signal RCSL, which activates the redundant column in the selected sub-arrays 8. Further, in accordance with a primary aspect of the present invention, if it is discovered that the defective column is shared in common by less than the selected sub-arrays 8, then the block selection control circuit 400 can be additionally programmed to be responsive to only the address of the larger sub-arrays which contain the defective column. For example, if only the sub-array 12 contains the defective column, then the fuses connected to the Vcc terminal and to the DRA/12 terminal in the decoder unit 400E can be severed, so that the node P5 will only go high when the DRA12 memory block address bit goes high. Thus, the output of the NAND gate 51 will only be driven low when both the DRA12 and DRA8 bits are both high. In this case, the output φRENi of the NOR gate 64 will only be driven high when the fuse box array 200 receives the column address corresponding to the defective column, and the block selection control circuit receives high logic level memory block address bits DRA12 and DRA8. Thus, in this instance, only the redundant column in the sub-arrays 8 contained within the sub-array 12 will be activated, and only the defective column in the sub-arrays 8 within the sub-array 12 in the normal memory array will be repaired. Of course, the block selection control circuit 400 can be programmed with any other combination of memory block address bits in order to selectively repair the defective column in any one or more of the sub-arrays 8, 9, 10, 11, and 12.

Figure 8:
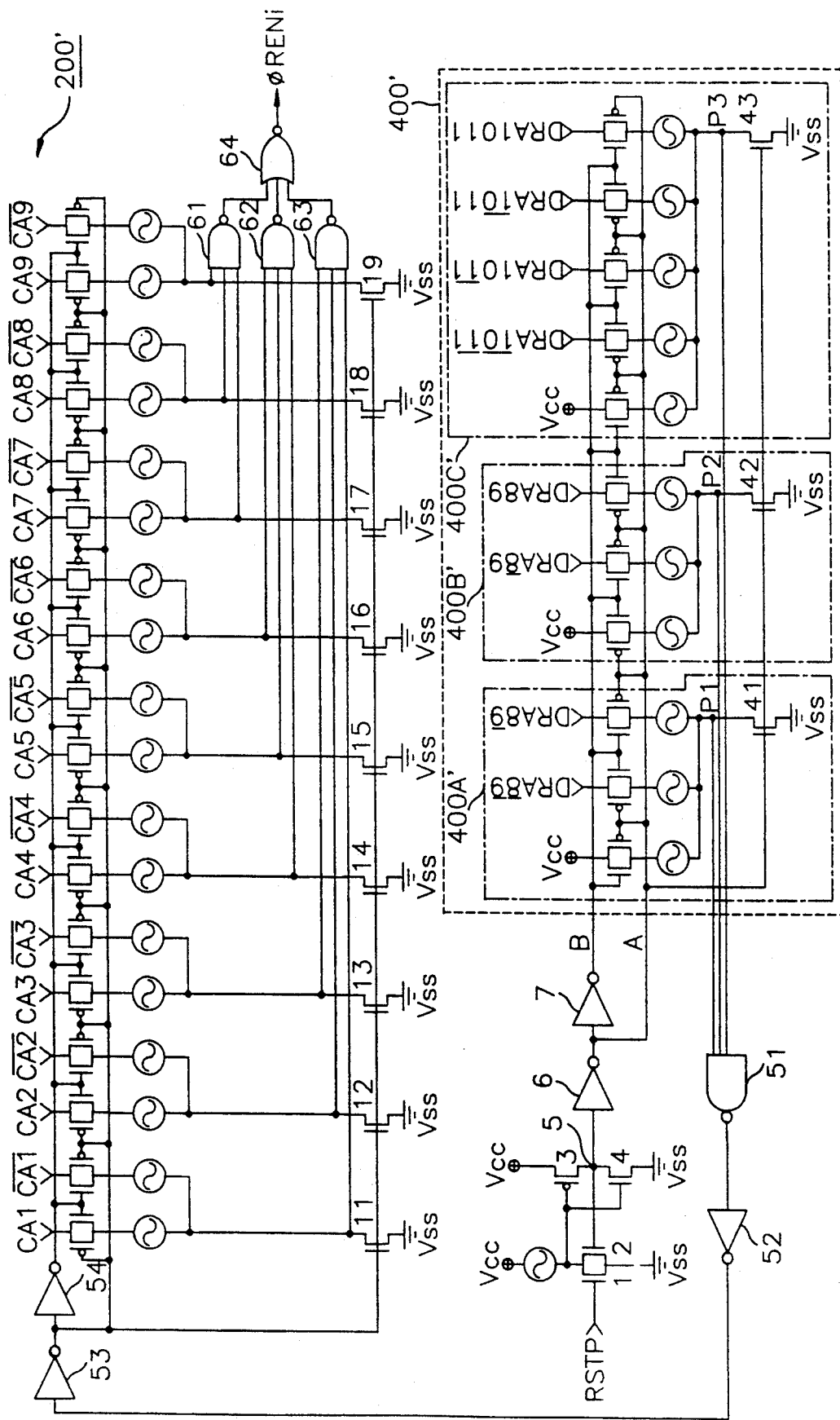

With reference now to FIG. 8, there can be seen an alternative embodiment of the block selection control circuit 400, which is identified as 400'. The block selection control circuit 400' operates in a manner analogous to the operation of the block selection control circuit 400 described hereinabove, except that the memory block address bits DRAij are selectively combined prior to being applied to the DRAij terminals of the individually programmable decoder units 400A'–400C' of the block selection control circuit 400'. With this arrangement, the decoder units 400A'–400C' can be more easily programmed to activate selected combinations of sub-arrays sharing a common defective column. For example, by blowing the fuses connected to Vcc and to memory block address terminal DRA8/9 in the decoder unit 400A', the node P1 will only go high when the combination memory block address bit DRA/8/9 goes high. In this case, the output of the NAND gate 51 will go low, and the output φRENi of the NOR gate 64 will go high, thereby facilitating the repair of the defective column in all of the sub-arrays /8 contained within the sub-arrays /9.

Although the present invention has been described in detail hereinabove, its should be clearly understood that many variations and/or modifications of the basic inventive concepts herein taught which may appear to those skilled in the pertinent art will still fall within the spirit and scope of the present invention as defined in the appended claims.

What is claimed is:

1. A column redundancy circuit for a semiconductor memory device including a normal memory array comprised of a plurality of memory blocks each comprised of a matrix of rows and columns of memory cells, with at least two of the memory blocks sharing common columns, and with at least one of the columns being defective, in the sense of being connected to at least one memory cell which has been determined to be defective, the column redundancy circuit comprising:

a plurality of redundant columns;

block selection control circuit means programmed to generate a first output signal in response to receipt of a memory block address signal corresponding to one or more of said memory blocks which contain said defective column, wherein said block selection control circuit means includes a plurality of fuses and is programmed by means of a selected one or more of said fuses being blown;

column address decoder means programmed to generate a second output signal in response to receipt of both said first output signal and a column address signal corresponding to said defective column; and, redundant column driver means responsive to said second output signal for activating a predetermined one of said redundant columns, to thereby repair said defective column.

2. The column redundancy circuit as set forth in claim 1, wherein said block selection control circuit means comprises a plurality of individually programmed decoder units.

3. The column redundancy circuit as set forth in claim 2, wherein each of said decoder units includes a plurality of fuses.

4. The column redundancy circuit as set forth in claim 1, wherein said column address decoder means includes a plurality of fuses and is programmed by means of a selected one or more of said fuses being blown.

5. The column redundancy circuit as set forth in claim 4, wherein said normal memory array is a multi-tiered memory array including a plurality of sub-arrays ranging from largest sub-array units $A_i/A$ to smallest sub-array units $Z_i/Z$ nested within said largest sub-array units $A_i/A$.

6. The column redundancy circuit as set forth in claim 2, wherein each of said individually programmed decoder units comprises:

a control terminal connected to a source of static voltage;

a memory block address signal terminal for receiving a memory block address signal identifying one or more of said memory blocks;

a control node;

switching means having a first electrode portion connected to said control and memory block address signal terminals and a second electrode portion;

a control fuse connected between said second electrode portion of said switching means and said control node;

a programming fuse connected between said second electrode portion of said switching means and said control node; and, wherein said block selection control circuit means is programmed by means of a selected one or more of said control fuses and said programming fuses being blown.

7. The column redundancy circuit as set forth in claim 6, wherein said normal memory array is a multi-tiered memory array including a plurality of sub-arrays ranging from largest sub-array units $A_i/A$ to smallest sub-array units $Z_i/Z$ nested within said largest sub-array units $A_i/A$.

8. The column redundancy circuit as set forth in claim 6, further comprising signal generating means responsive to receipt of a row address signal for generating an enable signal.

9. The column redundancy circuit as set forth in claim 8, wherein said row address signal corresponds to that of a defective memory call connected to said defective column.

10. The column redundancy circuit as set forth in claim 8, wherein said switching means is turned on in response to receipt of said enable signal.

11. The column redundancy circuit as set forth in claim 6, wherein said source of static voltage comprises the power supply voltage of said memory device.

12. The column redundancy circuit as set forth in claim 11, wherein said memory device comprises a dynamic random access memory device.

13. The column redundancy circuit as set forth in claim 2, wherein each of said decoder units comprises:
   a control terminal connected to a static voltage;
   a first memory block address signal terminal adapted to receive a first memory block address signal identifying a first one of said memory blocks;
   a second memory block address signal terminal adapted to receive a second memory block address signal identifying a second one of said memory blocks;
   a control node;
   switching means having a first electrode portion connected to said control and first and second memory block address signal terminals, and a second electrode portion;
   a control fuse connected between said second electrode portion of said switching means and said control node;
   a first programming fuse connected between said second electrode portion of said switching means and said control node;
   a second programming fuse connected between said second electrode portion of said switching means and said control node; and
   wherein said block selection control circuit means is programmed by means of a selected one or more of said control fuses and a selected one or more of said first and second programming fuses being blown.

14. The column redundancy circuit as set forth in claim 13, further comprising logic gate means having a plurality of inputs connected to said control node of respective ones of said individually programmed decoder units of said block selection control circuit means.

15. The column redundancy circuit as set forth in claim 14, wherein said logic gate means is responsive to said control nodes all going to the same logic level for generating said first output signal.

16. The column redundancy circuit as set forth in claim 15, wherein said column address decoder means includes a plurality of fuses and is programmed by means of a selected one or more of said fuses being blown.

17. The column redundancy circuit as set forth in claim 16, further comprising signal generating means responsive to receipt of a row address signal for generating an enable signal.

18. The column redundancy circuit as set forth in claim 17, wherein said switching means is turned on in response to receipt of said enable signal.

19. The column redundancy circuit as set forth in claim 13, wherein said control and first and second programming fuses are selectively blown by means of a laser.

* * * * *